United States Patent
Anderson et al.

(10) Patent No.: US 10,741,544 B2
(45) Date of Patent: Aug. 11, 2020

(54) INTEGRATION OF ELECTROSTATIC DISCHARGE PROTECTION INTO VERTICAL FIN TECHNOLOGY

(71) Applicant: International Business Machines Corporation, Armonk, NY (US)

(72) Inventors: Brent A. Anderson, Jericho, VT (US); Huiming Bu, Glenmont, NY (US); Terence B. Hook, Jericho, VT (US); Xuefeng Liu, Schenectady, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 16/185,745

(22) Filed: Nov. 9, 2018

(65) Prior Publication Data
US 2020/0152619 A1    May 14, 2020

(51) Int. Cl.
*H01L 29/66* (2006.01)
*H01L 27/02* (2006.01)
*H01L 29/78* (2006.01)

(52) U.S. Cl.
CPC .... *H01L 27/0274* (2013.01); *H01L 29/66666* (2013.01); *H01L 29/7827* (2013.01)

(58) Field of Classification Search
CPC .......... H01L 27/0274; H01L 29/66666; H01L 29/7827
USPC .................................................. 438/212, 268
See application file for complete search history.

(56) References Cited

U.S. PATENT DOCUMENTS

| | | | |
|---|---|---|---|
| 7,700,449 B2 | 4/2010 | Lee | |
| 8,890,249 B2 | 11/2014 | Gauthier, Jr. et al. | |
| 9,219,056 B2 | 12/2015 | Clark, Jr. et al. | |
| 9,391,060 B2 | 7/2016 | Hellings et al. | |
| 9,653,448 B2 | 5/2017 | Zhang et al. | |
| 9,865,589 B1 | 1/2018 | Lee et al. | |
| 9,871,032 B2 | 1/2018 | Toh et al. | |
| 9,893,054 B2 | 2/2018 | Chen | |
| 10,211,206 B1* | 2/2019 | Zang | H01L 27/1104 |
| 2017/0250211 A1* | 8/2017 | Chang | H01L 27/1463 |
| 2017/0287897 A1 | 10/2017 | Li | |
| 2019/0287967 A1* | 9/2019 | Liaw | H01L 27/0207 |

OTHER PUBLICATIONS

Roman Boschke et al., "ESD Characterization of diodes and ggMOS in Germanium FinFET technologies", Electrical Overstress/Electrostatic Discharge Symposium (EOS/ESD), 2015, 9 pp.

* cited by examiner

*Primary Examiner* — Long K Tran
(74) *Attorney, Agent, or Firm* — Cantor Colburn LLP; Vazken Alexanian

(57) ABSTRACT

A method of fabricating a semiconductor device includes forming one or more fins on a substrate. The method includes forming a first active area and a second active area, each including an n-type dopant, on the substrate at opposing ends of the one or more fins. The method further includes forming a third active area including a p-type dopant on the substrate adjacent to the first active area and the second active area.

13 Claims, 16 Drawing Sheets

US 10,741,544 B2

INTEGRATION OF ELECTROSTATIC DISCHARGE PROTECTION INTO VERTICAL FIN TECHNOLOGY

BACKGROUND

The present invention generally relates to fabrication methods and resulting structures for semiconductor devices. More specifically, the present invention relates to integration of electrostatic discharge protection into vertical fin technology.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

A grounded-gate NMOS (ggNMOS) device is an electrostatic discharge (ESD) device used within CMOS integrated circuits. ESD devices protect the inputs and outputs of an integrated circuit (e.g., an input output (I/O) device), which can be accessed off-chip, such as by wire-bonding to the pins of a package or directly to a printed circuit board, and are therefore subject to electrostatic discharge when touched. An ESD event can deliver a large amount of energy to the chip, potentially destroying input/output circuitry. A ggNMOS device provides a safe path for current to flow, ultimately to the substrate, instead of through more sensitive circuitry.

SUMMARY

Embodiments of the present invention are directed to a method for fabricating a semiconductor device. A non-limiting example of the method includes forming one or more fins on a substrate. The method includes forming a first active area and a second active area, each including an n-type dopant, on the substrate at opposing ends of the one or more fins. The method further includes forming a third active area including a p-type dopant on the substrate adjacent to the first active area and the second active area.

Another non-limiting example of the method includes forming a plurality of fins on a substrate. The method includes forming a first active area and a second active area, each including an n-type dopant, on the substrate at opposing ends of the plurality of fins. The method further includes forming a third active area including a p-type dopant on the substrate adjacent to the second active area. The method includes coupling an input/output (I/O) device to the first active area through a metal contact.

Embodiments of the present invention are directed to a semiconductor device. A non-limiting example of the semiconductor device includes one or more fins on a substrate. The semiconductor device includes a first active area and a second active area, each including an n-type dopant, on the substrate at opposing ends of the one or more fins. The semiconductor device further includes a third active area including a p-type dopant on the substrate adjacent to the first active area and the second active area.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-15 depict a process flow for forming a semiconductor device according to one or more embodiments of the present invention, in which:

FIG. 1 depicts a cross-sectional side view of a semiconductor device subsequent to providing a substrate;

FIG. 2 depicts a cross-sectional side view of the semiconductor device subsequent to forming fins on the substrate;

FIG. 3 depicts a cross-sectional side view of the semiconductor device subsequent to depositing a mask on the fins;

FIG. 4 depicts a cross-sectional side view of the semiconductor device subsequent to forming openings in the mask;

FIG. 5 depicts a cross-sectional side view of the semiconductor device subsequent to forming doped active areas on the substrate;

FIG. 6 depicts a cross-sectional side view of the semiconductor device subsequent to removing the mask;

FIG. 7 depicts a cross-sectional side view of the semiconductor device subsequent to depositing another mask on the fins;

FIG. 8 depicts a cross-sectional side view of the semiconductor device subsequent to forming openings in the mask:

FIG. 9 depicts a cross-sectional side view of the semiconductor device subsequent to formed doped active areas on the substrate;

FIG. 10 depicts a cross-sectional side view of the semiconductor device subsequent to removing the mask;

FIG. 11 depicts a cross-sectional side view of the semiconductor device subsequent to forming a first spacer on the substrate;

FIG. 12 depicts a cross-sectional side view of the semiconductor device subsequent to forming gate stacks around the fins and depositing an interlevel dielectric (ILD);

FIG. 13 depicts a cross-sectional side view of the semiconductor device subsequent to forming a second spacer on the gate stacks and forming active areas;

FIG. 15 depicts a cross-sectional side view of the semiconductor device subsequent to coupling an input/output (I/O) device through a metal layer to the contacts.

Figure 1:
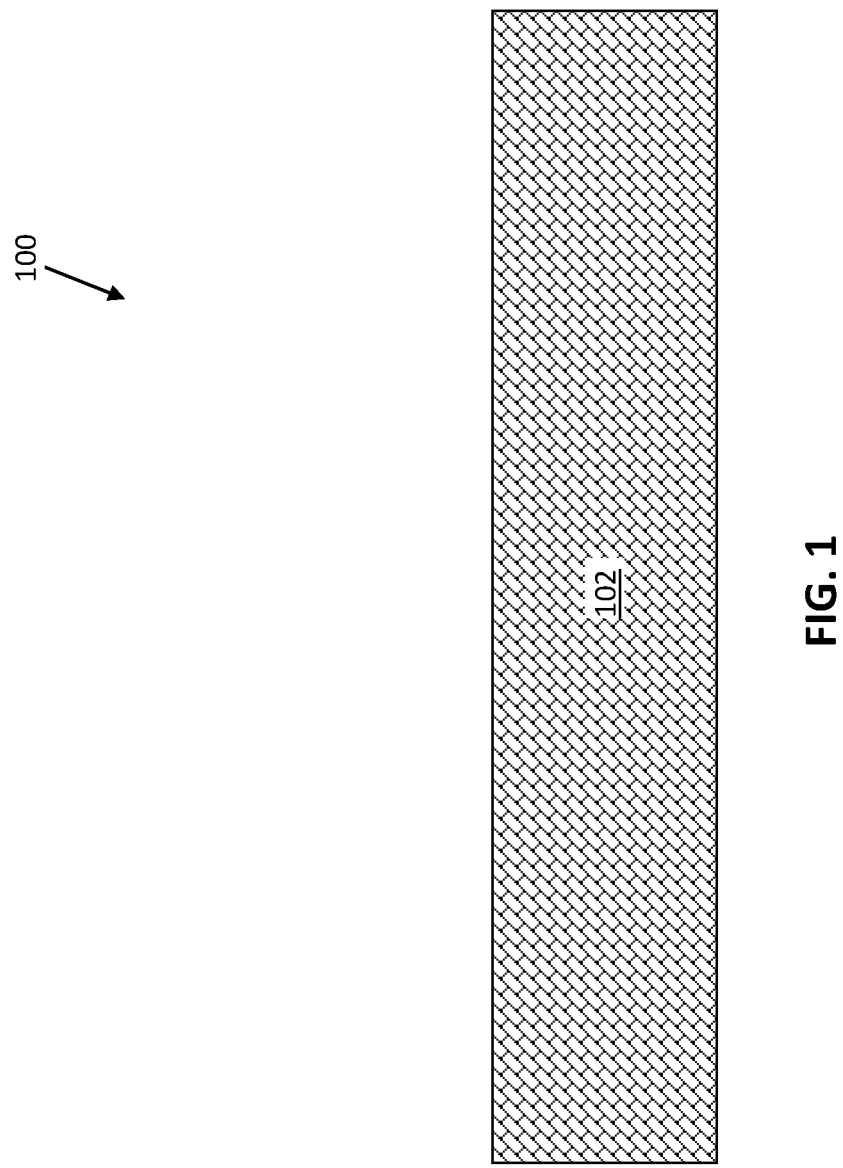

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, ggNMOS devices include a relatively wide NMOS device, in which the gate, source, and body are tied together to ground. The drain of the ggNMOS is connected to the I/O pad under protection. A parasitic NPN bipolar junction transistor (BJT) is thus formed with the drain (n-type) acting as the collector, the base/source combination (n-type) as the emitter, and the substrate (p-type) as the base. A key element to the operation of a ggNMOS device is the parasitic resistance between the emitter and base terminals of the parasitic NPN BJT, which results from the finite conductivity of the p-type doped substrate. Due to these advantages, ggNMOS devices are widely applied in IC ESD protection because of the effectiveness of the parasitic lateral NPN bipolar junction's ability to manage high currents.

As electronic parts like computer central processing units (CPUs) become packed more densely packed with transistors, the transistors shrink and become more vulnerable to ESD. However, ggNMOS protection devices have not been applied to advanced technologies, such as vertical fin technologies due to structural limitations.

Vertical transistors, in which source/drains are arranged on opposing ends of a vertical channel region (or fin) surrounded by a gate, are attractive candidates for scaling to smaller dimensions. The fin body of these devices is isolated from the substrate. Vertical transistors thus can provide higher density scaling that alleviate middle-of-line (MOL) fabrication complexity. However, due to the vertical nature of the fin channel, vertical devices do not include a parasitic bipolar NPN in shunt with the CMOS, and therefore, a NMOS is not available to perform the ESD protection function. Accordingly, there is a need to provide a method and device to protect vertical fin technologies from damaging ESD.

Turning now to an overview of the aspects of the invention, one or more embodiments of the invention address the above-described shortcomings of the prior art by providing methods for fabricating and resulting devices that include a fin structure in shunt with a NPN bipolar junction as an ESD element for vertical fin technology applications. A bipolar parasitic NPN structure is arranged beneath the vertical fin. The bipolar emitter and corrector self-align to the outer fin and base width of one or more fins, which is defined by the number of fins of the plurality of fins. The distance from the emitter to the collector is not limited by the small width of the vertical fin itself. The number of fins defining the width of the base can be chosen to depend on the "snap back" holding voltage and electrostatic discharging current capability. "Snap back" is a mechanism in a bipolar transistor, in this case it is the lateral NPN under the fins, in which avalanche breakdown or impact ionization occurs and provides a sufficient base current to turn on (e.g., trigger) the transistor. "Snap back" is used in the design of some ESD protection devices integrated onto semiconductor chips. When impact ionization occurs for the bipolar NPN, the breakdown voltage will resume to the initial value, and then once stabilized, be held at that value. While the voltage is being held, the current runs high and flows into the ground, as one terminal of the NPN is grounded. The high current in ESD case is therefore released through the ESD device. Since a majority of the ESD event is transient, the released current will bypass the circuit to protect the circuit from damage. An ESD current thus flows from the I/O device or pad to be protected to the substrate of the ggNMOS.

The above-described aspects of the invention address the shortcomings of the prior art by providing a ggNMOS ESD protection device that is applied to vertical fin technology. The bipolar NPN junction can hold a relatively high voltage (i.e., much greater than the threshold voltage) due to the large lateral distance between the n-type collector (drain) and n-type emitter (source), which again can be varied by the number of fins in the plurality of fins. The triggering voltage to of the device is therefore above the threshold voltage, and any ESD that occurs can be "snapped back" before the device reaches circuit failure. The protective devices are fully compatible with existing vertical fin fabrication processes, without much additional processing. Due to the grounded gate and wide base width, the methods and structures can prevent ESD events from damaging any coupled I/O device.

Turning now to a more detailed description of aspects of the present invention, FIGS. 1-15 depict a process flow for forming a semiconductor device 100 according to one or more embodiments of the present invention. FIG. 1 depicts a cross-sectional side view of the semiconductor device 100 after providing a substrate 102. The substrate 102 includes one or more semiconductor materials. Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

Figure 2:
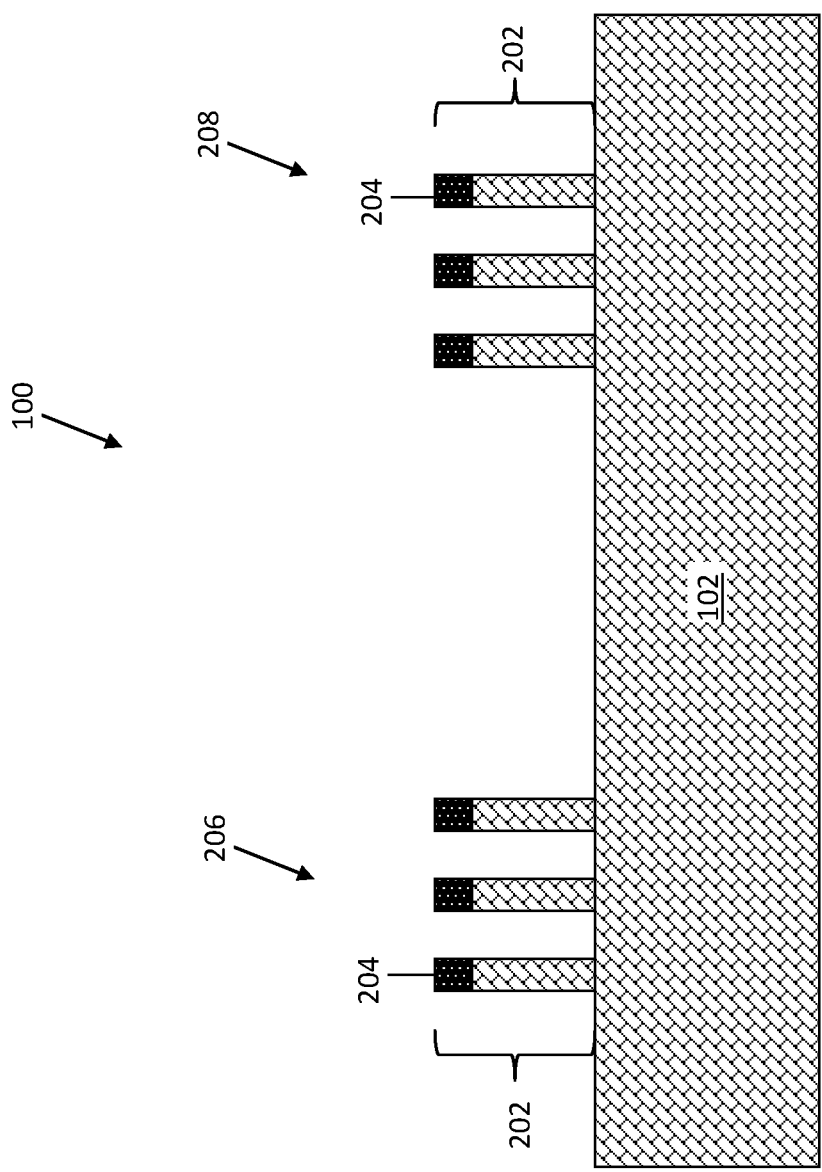

FIG. 2 depicts a cross-sectional side view of the semiconductor device 100 subsequent to forming fins 202 on the substrate 102. The fins 202 each include a hard mask cap 204. The fins 202 can be formed in the substrate 101 by, for example, depositing a hard mask material over the substrate 102, followed by patterning and etching the substrate 102. The fins 202 also can be patterned in the substrate by, for example, sidewall imaging transfer. The hard mask cap 204 of the fins 202 include one or more hard mask materials, such as for example, silicon nitride, silicon oxide, or a combination thereof.

A first plurality of fins 206 and a second plurality of fins 208 are formed. Although three fins are shown in each of the first and second plurality of fins 206 and 208, each plurality is not limited to three fins. Each of the first and second plurality of fins 206, 208 includes one or more fins. For example, each of the first and second plurality of fins 206, 208 includes, independently, 1, 2, 3, 4, 5, or more fins. The first and second plurality of fins 206, 208 include the same number of fins, or a different number of fins. According to one or more embodiments of the present invention, each of the first and second plurality of fins 206, 208 includes 1 to 100 fins.

Figure 3:
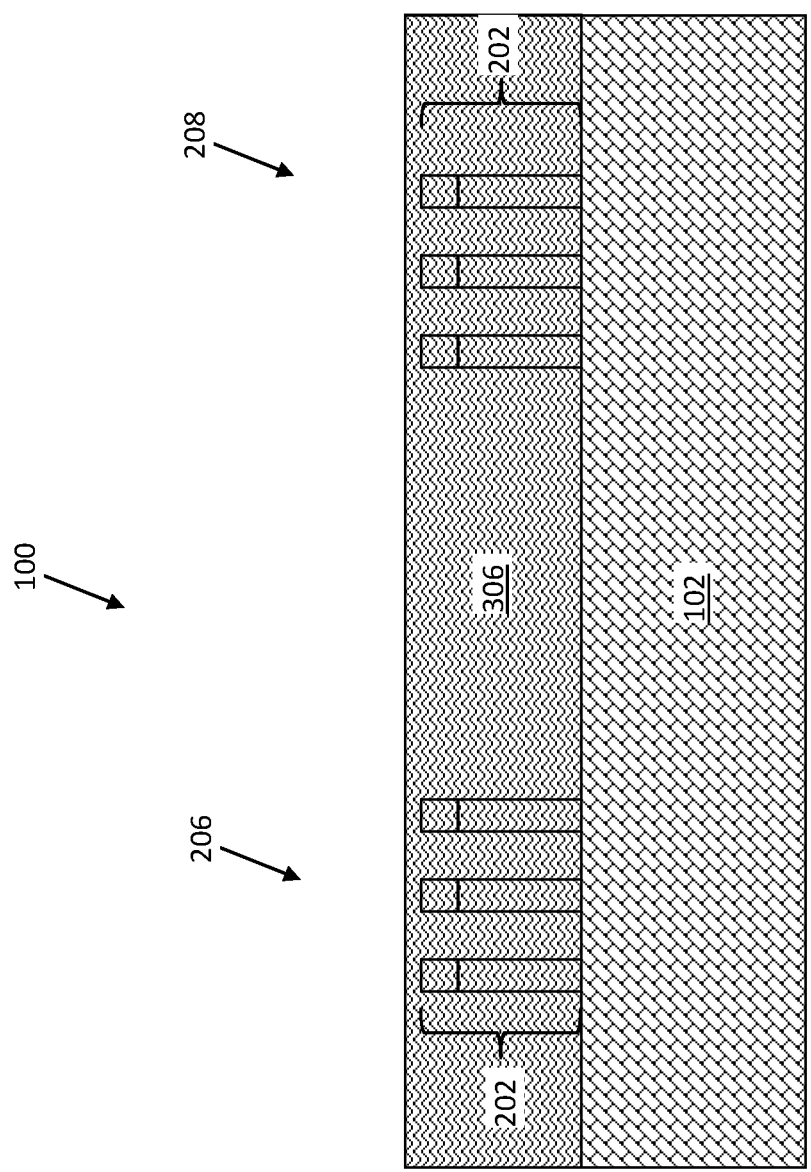

FIG. 3 depicts a cross-sectional side view of the semiconductor device 100 subsequent to depositing a mask 306 on the fins 202. The mask 306 (also referred to as the first mask 306 herein) includes one or more layers of a mask material, such as an oxide material, a photoresist, or a spin on mask material. The mask 306 is deposited to cover the fins 202.

Figure 4:
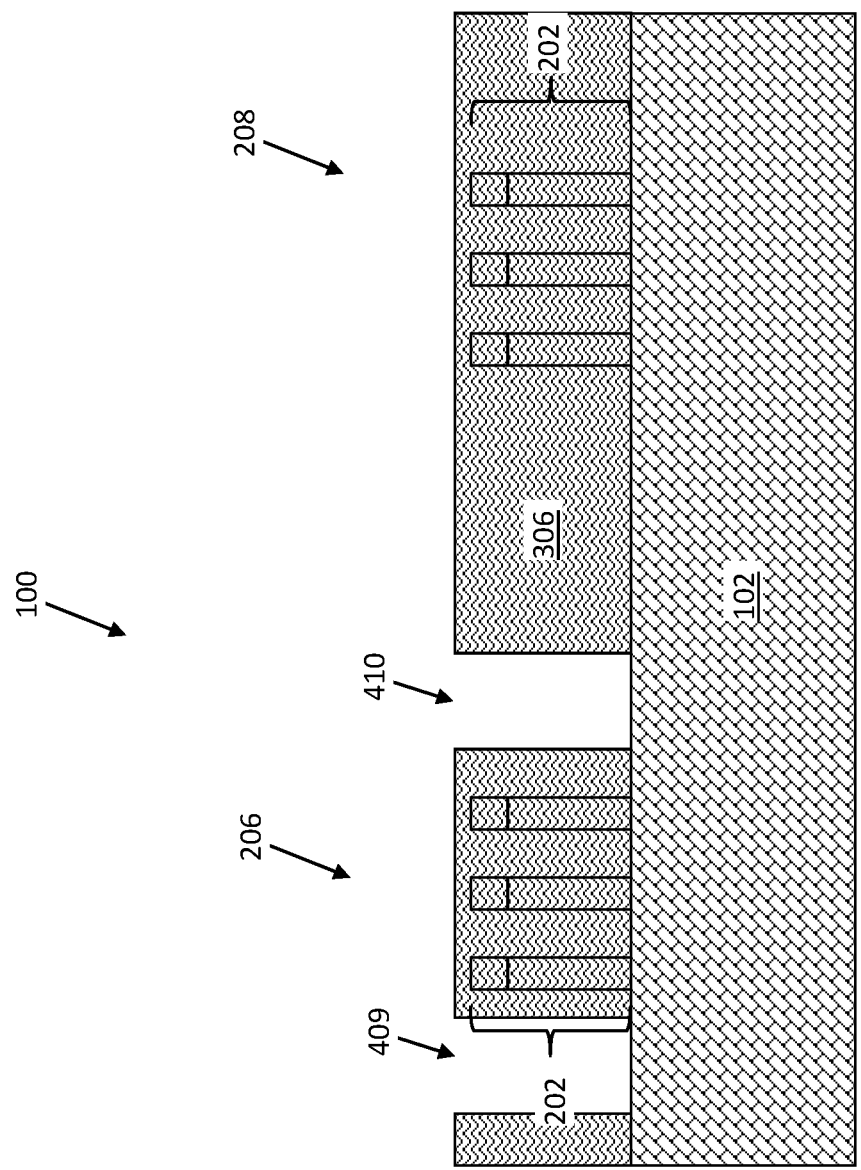

FIG. 4 depicts a cross-sectional side view of the semiconductor device 100 subsequent forming openings 409, 410 in the mask 306. The openings 409, 410 (also referred to as first and second openings herein, respectively) are formed by removing portions of the mask 306 material by, for example, one or more etching processes. The openings 409, 410 in the mask 306 are arranged on opposing sides or ends (or horizontal ends) of the first plurality of fins 206. The openings 409, 410 extend through the mask 306 to expose the substrate 102.

Figure 5:
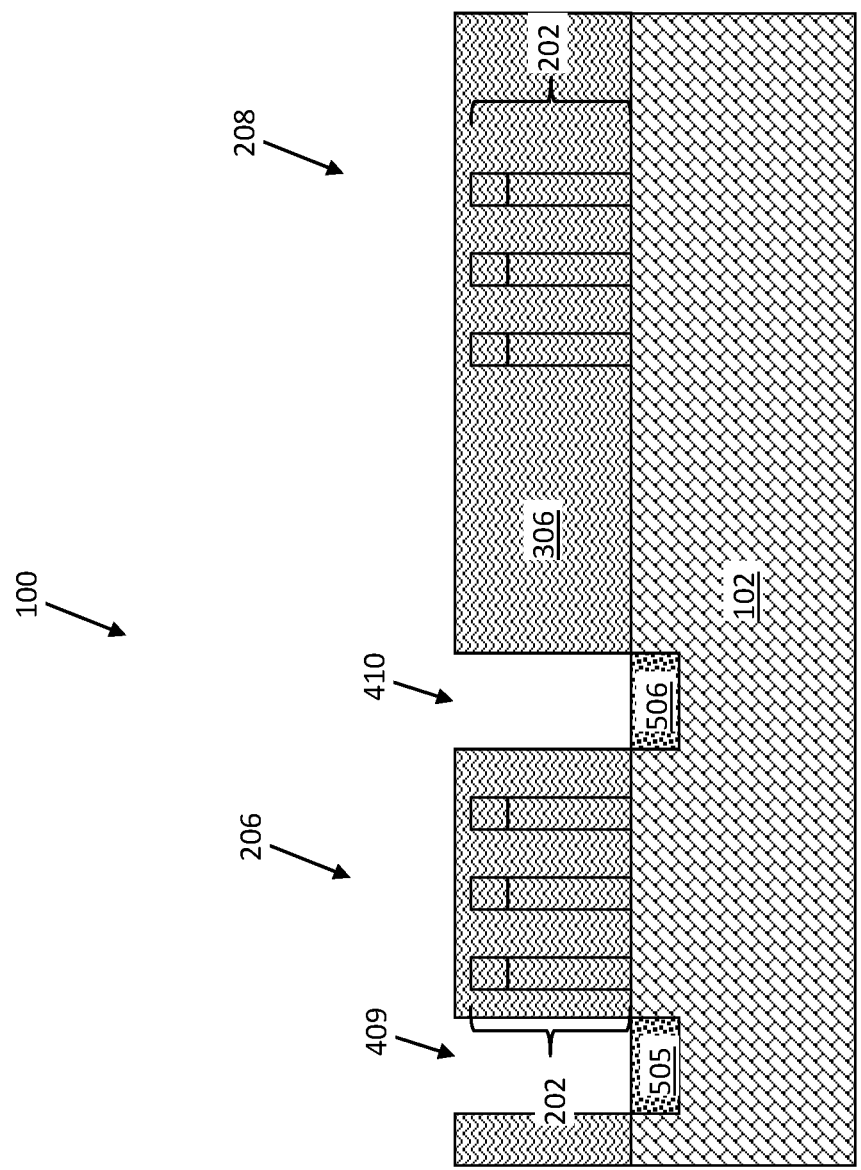

FIG. 5 depicts a cross-sectional side view of the semiconductor device 100 subsequent to forming doped active areas 505, 506 on the substrate 102. The doped active area 505 is also referred to as the first doped active area, and the doped active area 506 is also referred to as the second doped active area. The substrate 102 exposed at the bottom of the openings 409, 410 in the mask 306 is optionally partially recessed. Epitaxial semiconductor material is formed on the substrate 102 to form the doped active areas 505, 506. The epitaxial semiconductor material, e.g., silicon, germanium, or a combination thereof, includes an n-type dopant. Epitaxial material can be grown using vapor-phase epitaxy (VPE), molecular-beam epitaxy (MBE), liquid-phase epitaxy (LPE), or other suitable process. The epitaxial material is doped during deposition by adding an n-type dopant (e.g., phosphorus, arsenic, or antimony).

Figure 6:
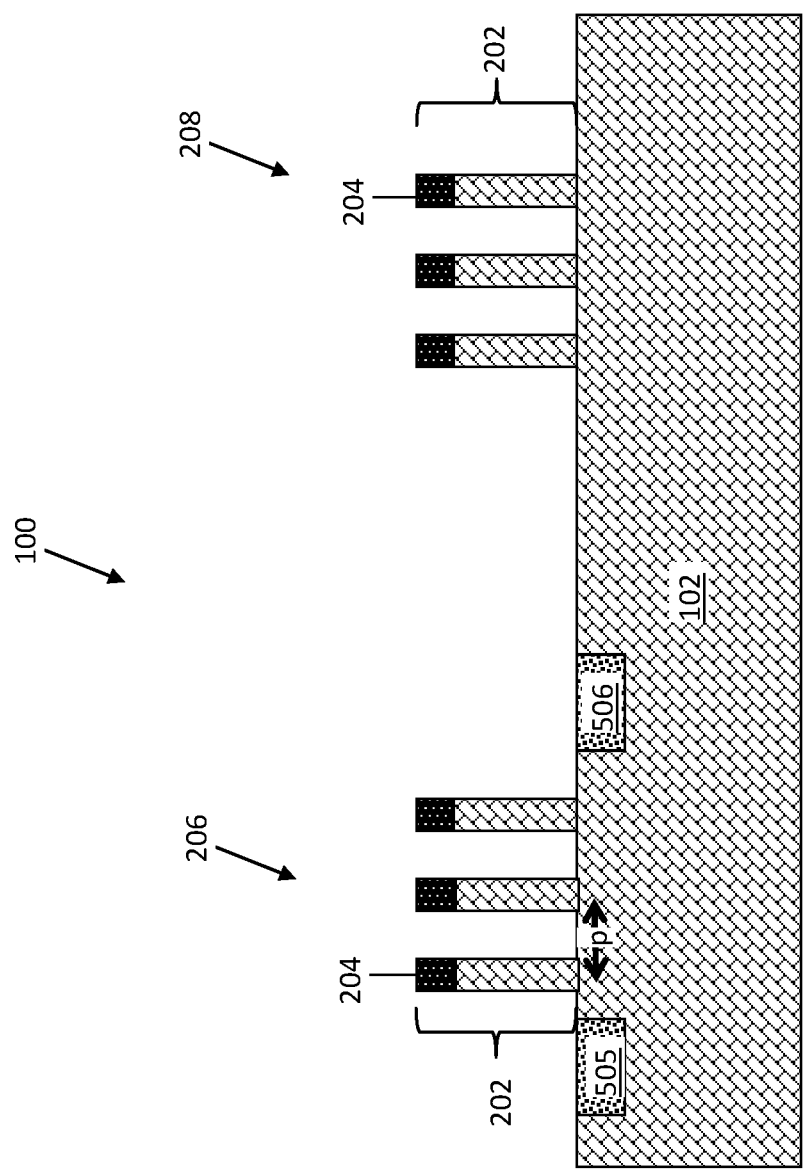

FIG. 6 depicts a cross-sectional side view of the semiconductor device 100 subsequent to removing the mask 306, exposing the first plurality of fins 206 and the second plurality of fins 208. The mask 306 is removed by, for example, one or more etching processes and/or ashing.

The distance (d) between the terminal fins 202 of the first plurality of fins 206 is variable and depends on the number of fins 202 within the first plurality of fins 206, and the fin pitch (p) within the plurality. The fin pitch (p) is the center-to-center distance between nearest neighbor fins 202. The distance (d) determines the distance between the active areas 505, 506.

According to one or more embodiments of the present invention, the pitch (p) of the fins 202 in first plurality 206 is about 20 to about 50 nm. According to other embodiments of the present invention, the pitch (p) of the fins 202 in the first plurality 206 is about 22 to about 42 nm.

Figure 7:
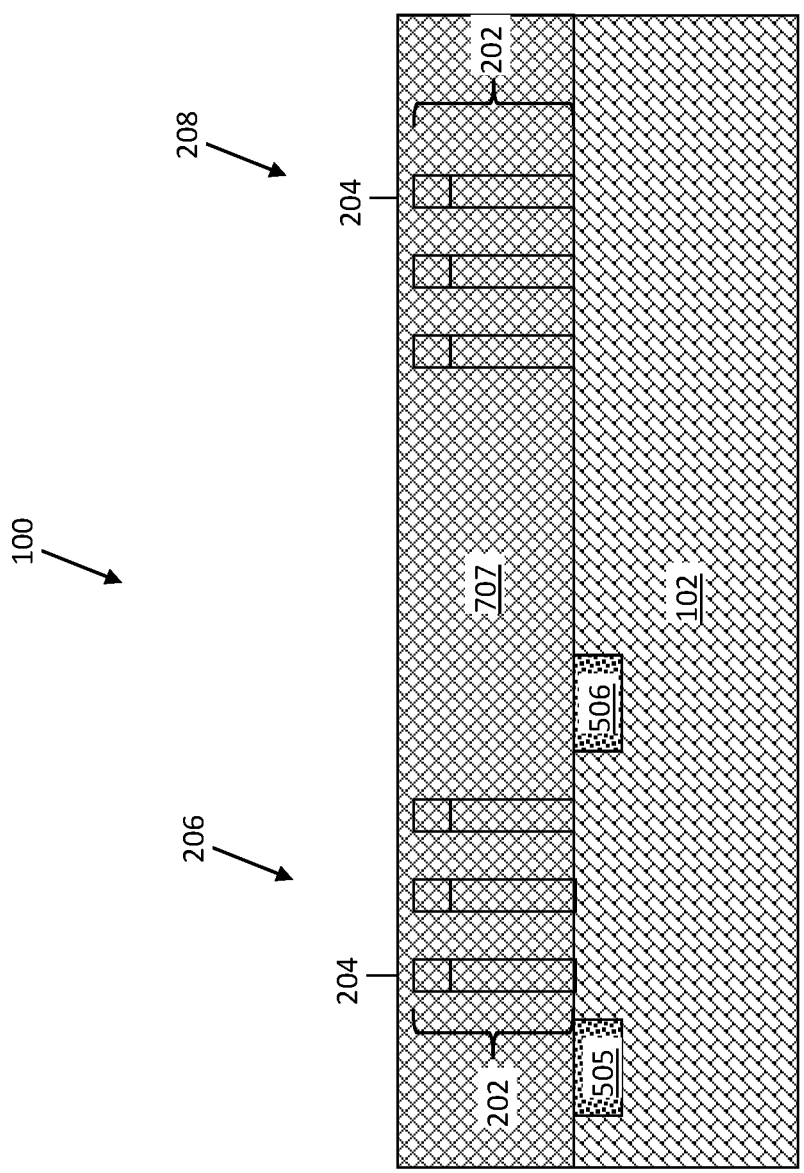

FIG. 7 depicts a cross-sectional side view of the semiconductor device 100 subsequent to depositing another mask 707 on the fins 202. The mask 707 (also referred to as the second mask 707 herein) includes one or more layers of a mask material, such as an oxide material, a photoresist, or a spin on mask material. The mask 707 is deposited to cover the fins 202. The mask 707 can be the same or different than the mask 306 (first mask).

Figure 8:
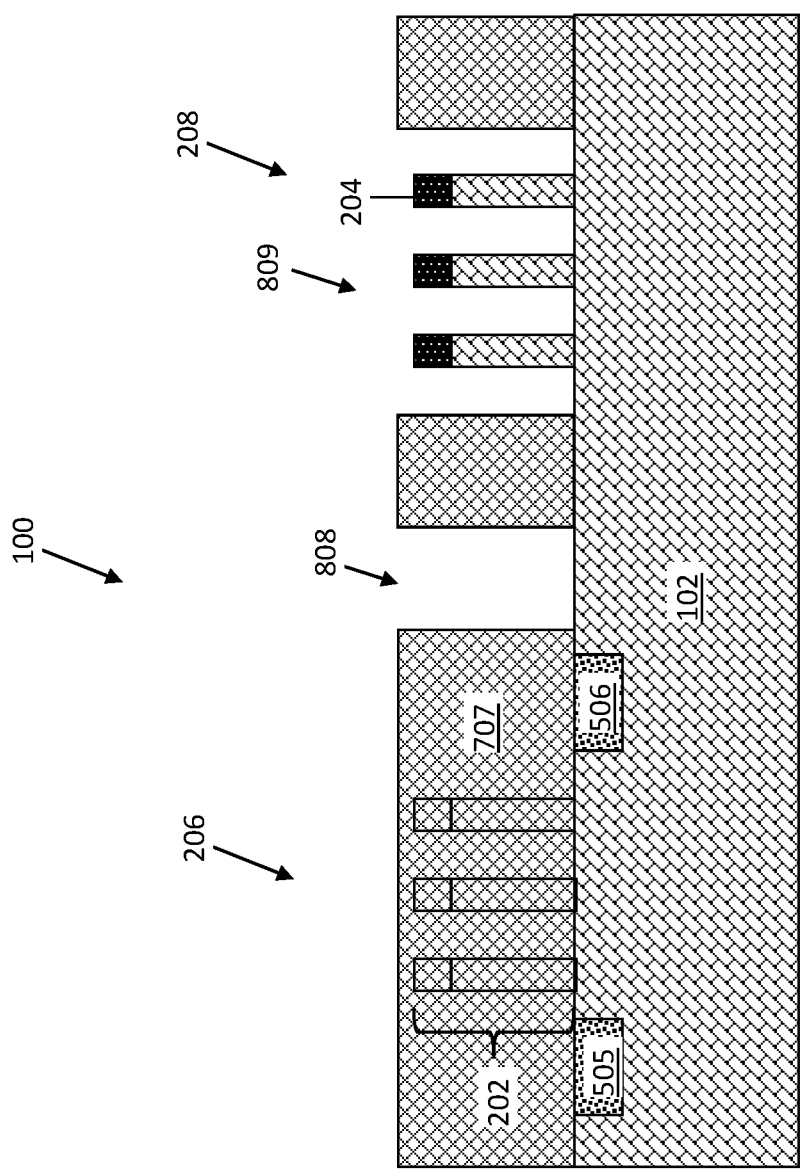

FIG. 8 depicts a cross-sectional side view of the semiconductor device 100 subsequent to forming openings 808, 809 in the mask 707. The openings 808, 809 (also referred to as first and second openings herein, respectively) are formed by removing portions of the mask 707 material by, for example, one or more etching processes. The first opening 808 in the mask 707 is formed in an area between the first plurality of fins 206 and the second plurality of fins 208. The second opening 809 in the mask 707 is formed in the area of the mask 707 covering the second plurality of fins 208. The openings 808, 809 extend through the mask 707 to expose the substrate 102.

Figure 9:
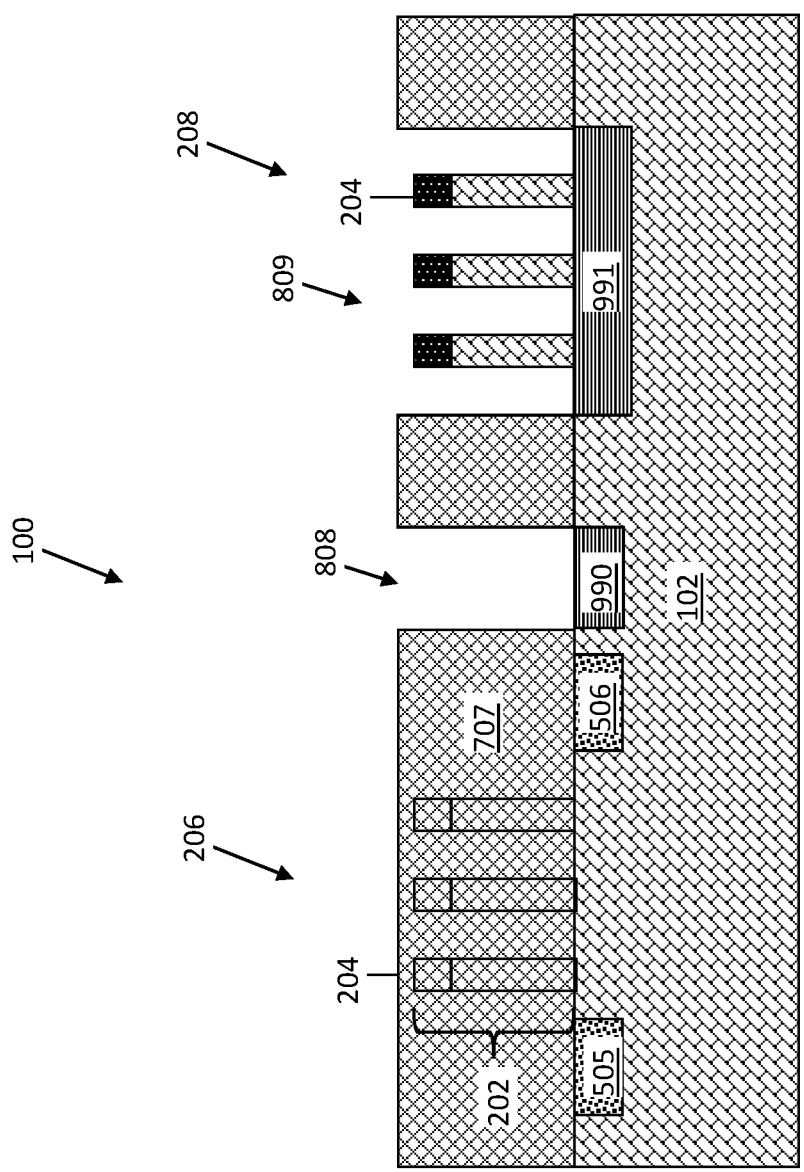

FIG. 9 depicts a cross-sectional side view of the semiconductor device 100 subsequent to formed doped active areas 990, 991 on the substrate 102. The substrate 102 exposed at the bottom of the openings 990, 991 is optionally partially recessed. Epitaxial semiconductor material is formed on the substrate 102 to form the doped active areas 990, 991. The epitaxial semiconductor material, e.g., silicon, germanium, or a combination thereof, includes a p-type dopant. Epitaxial material can be grown using vapor-phase epitaxy (VPE), molecular-beam epitaxy (MBE), liquid-phase epitaxy (LPE), or other suitable process. The epitaxial material is doped during deposition by adding p-type dopant (e.g., boron, aluminum, or gallium).

The doped active area 990 is arranged in an area of the substrate 102 between the doped active area 506 and the second plurality of fins 809. The doped active area 990 with the p-type dopant, in combination with doped active areas 505, 506 with the n-type dopant beneath the first plurality of fins 206, form a parasitic NPN junction beneath the first plurality of fins 206, which is part of a bipolar parasitic NPN device.

The doped active area 991 is arranged beneath the second plurality of fins 208. The second plurality of fins 208 form part of a different transistor device, e.g., a PFET device.

Figure 10:
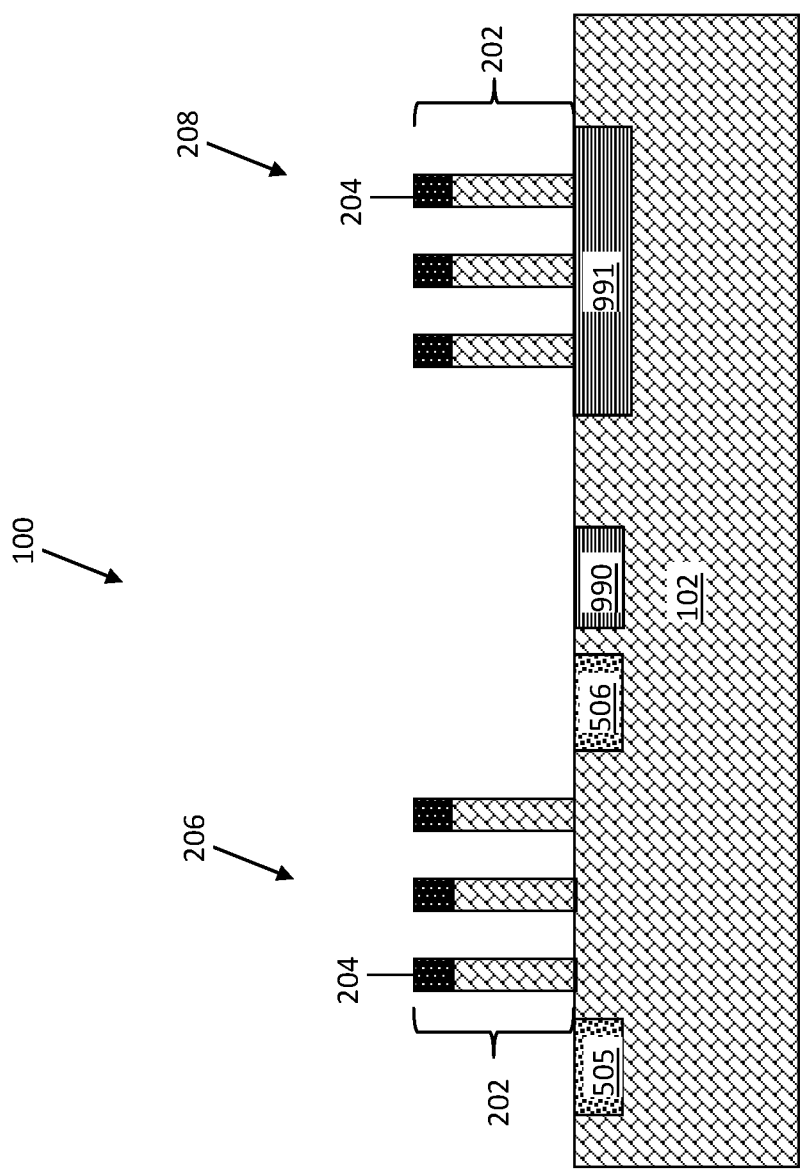

FIG. 10 depicts a cross-sectional side view of the semiconductor device 100 subsequent to removing the mask 707. The mask 707 is removed by, for example, one or more etching processes and/or ashing.

Figure 11:
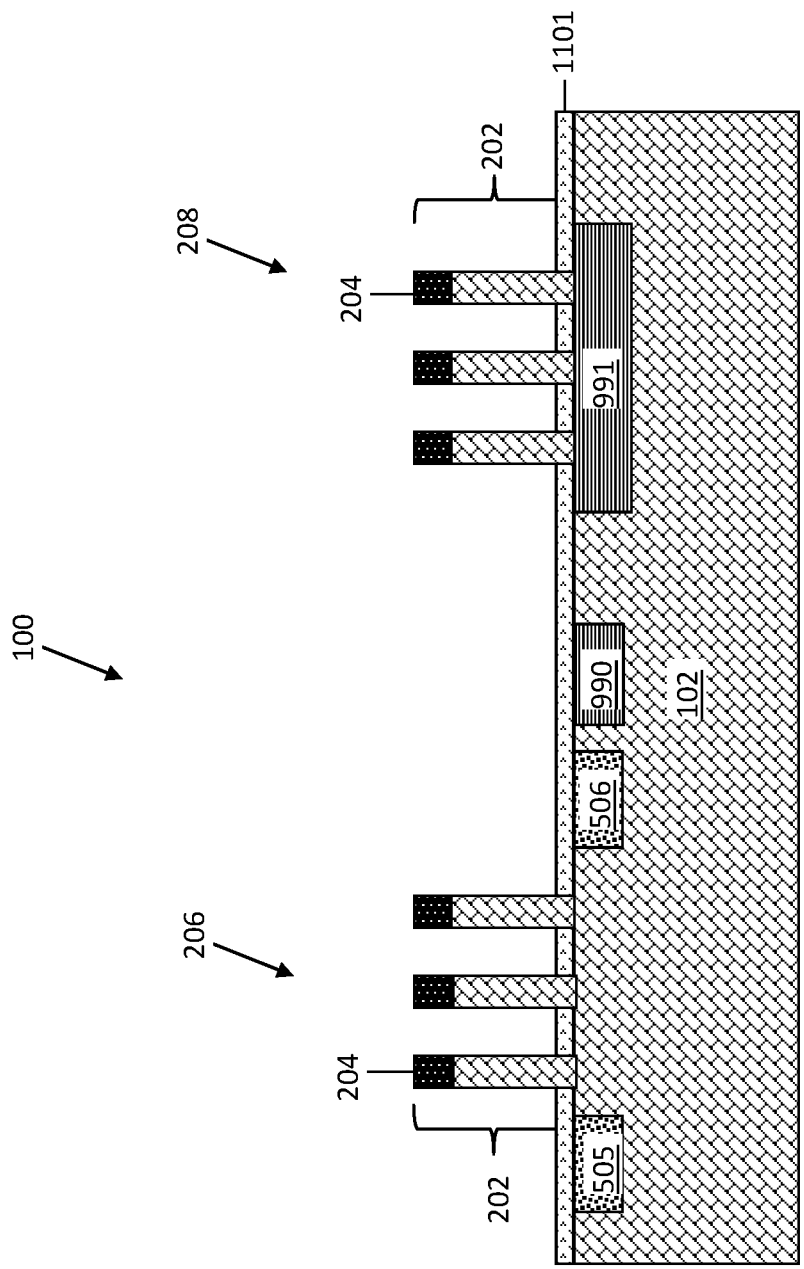

FIG. 11 depicts a cross-sectional side view of the semiconductor device 100 subsequent to forming a first spacer 1101 on the substrate 102 beneath the fins 202. The first spacer 1101 is also referred to as the bottom spacer herein. The first spacer 1101 includes a dielectric material, for example, silicon dioxide, silicon nitride, SiOCN, or SiBCN, or a combination thereof. The first spacer 1101 material is deposited by a deposition process, for example, chemical vapor deposition (CVD) or physical vapor deposition (PVD).

Figure 12:
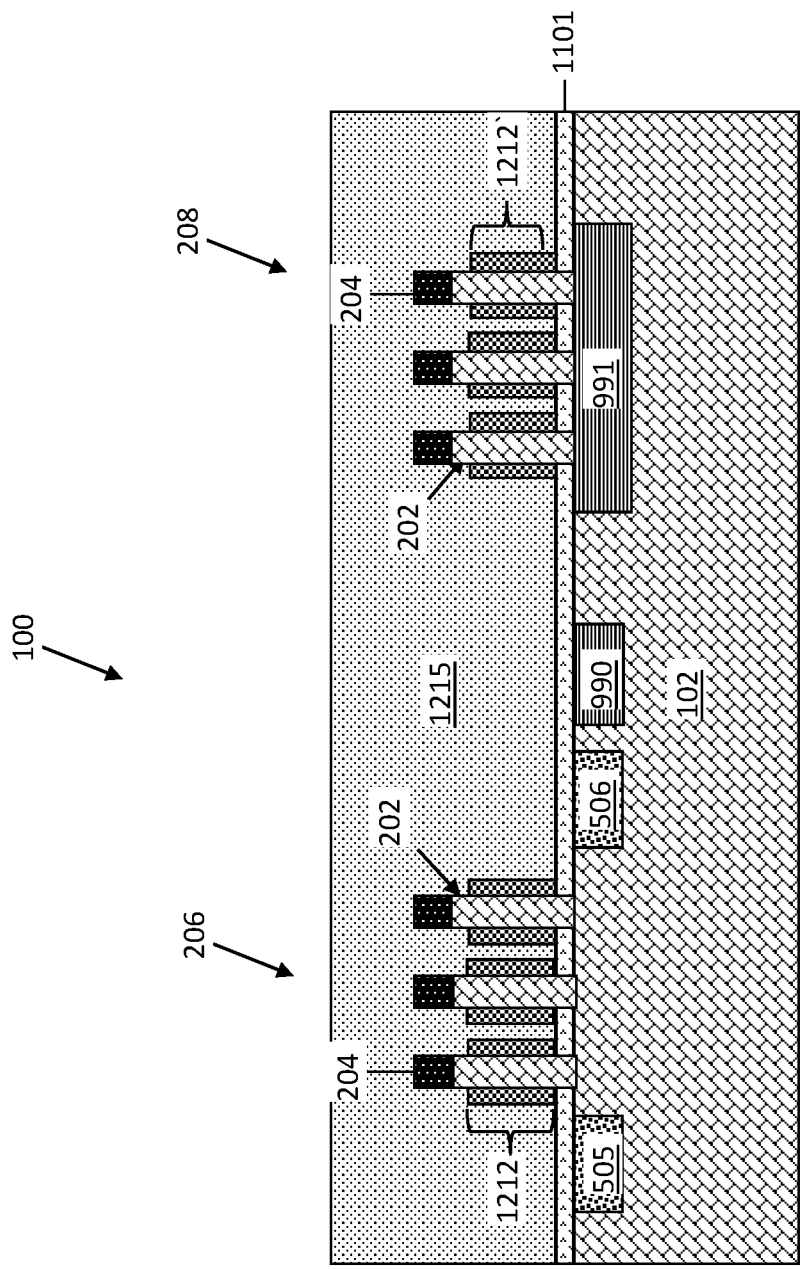

FIG. 12 depicts a cross-sectional side view of the semiconductor device 100 subsequent to forming gate stacks 1212 around the fins 202 and depositing an interlevel dielectric (ILD) 1215. The gate stacks 1212 wrap around the vertical channel region of the fins 202 and include one or more dielectric layers, one or more work function metal layers, and one or more gate metal layers.

Non-limiting examples of suitable materials for the dielectric layers of the gate stacks 1212 include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

The work function metal layers of the gate stacks 1212, 1212' are disposed over the gate dielectric material(s). Gate stack 1212 includes one or more n-type work function metal materials. N-type metal materials include, but are not limited to, materials including hafnium, zirconium, titanium, tantalum, aluminum, metal carbides (e.g., hafnium carbide, zirconium carbide, titanium carbide, and aluminum carbide), aluminides, or any combination thereof.

Gate stack 1212' includes either n-type or p-type work function metal materials, depending on the type of transistor. P-type work function metal materials include, but are not limited to, materials that include titanium nitride (TiN), tantalum nitride (TaN), ruthenium, palladium, platinum, cobalt, nickel, and conductive metal oxides, or any combination thereof. N-type metal materials include, but are not limited to, materials that include hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive gate metal is then deposited on the dielectric material(s) and work function layer(s) to form the gate stacks 1212, 1212'. Non-limiting examples of suitable conductive metals include aluminum, platinum, gold, tungsten, titanium, or any combination thereof. The conductive metal can be deposited by a suitable deposition process, for example, CVD, PECVD, PVD, plating, thermal or e-beam evaporation, and sputtering.

After forming the gate stacks 1212 around the fins 202, the ILD 1215 is deposited on first and second plurality of fins 206, 208. The ILD 1215 includes one or more dielectric materials, for example, an oxide. Non-limiting examples of oxides for the ILD 1215 include tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 13:
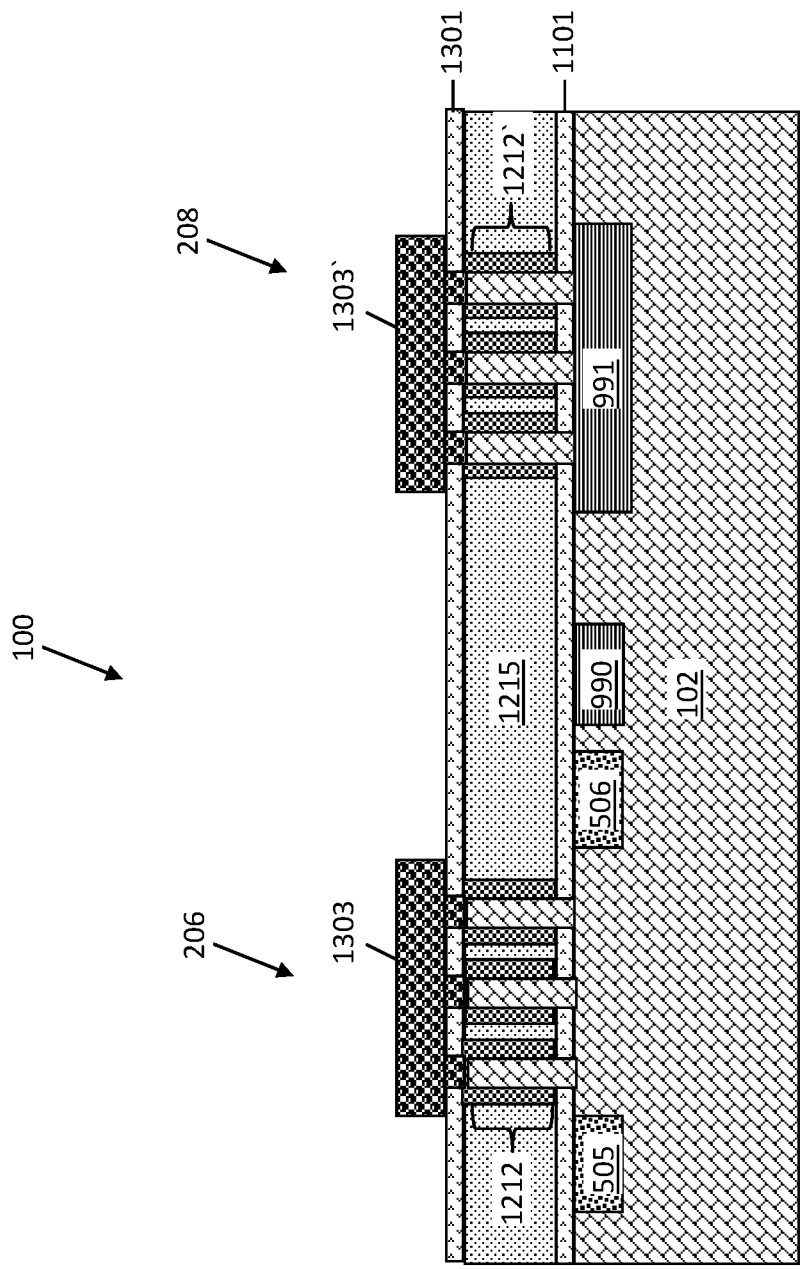

FIG. 13 depicts a cross-sectional side view of the semiconductor device 100 subsequent to forming a second spacer 1301 on the gate stacks 1212 and forming an active area 1303 on the fins 202. The second spacer 1301 is also referred to as the top spacer herein. The second spacer 1301 includes a dielectric material, for example, silicon dioxide, silicon nitride, SiOCN, or SiBCN, or a combination thereof. The second spacer 1301 material is deposited by a deposition process, for example, chemical vapor deposition (CVD) or physical vapor deposition (PVD). The second spacer 1301 includes the same material as the first spacer 1101, or a different material than the first spacer 1101.

After forming the second spacer 1301, the spacer material is partially recessed to expose the tops of the fins 202, where the top active areas will be formed. The active areas 1303, 1303' include a doped semiconductor material. The epitaxial semiconductor material of the active areas 1303, 1303' include, e.g., silicon, germanium, or a combination thereof, includes an n-type dopant or a p-type dopant. Epitaxial material can be grown using vapor-phase epitaxy (VPE), molecular-beam epitaxy (MBE), liquid-phase epitaxy (LPE), or other suitable process. The epitaxial material is doped during deposition by adding an n-type dopant to form active area 1303 (e.g., phosphorus, arsenic, or antimony), and a p-type dopant to form active area 1303' (e.g., boron, aluminum, or gallium). According to some embodiments of the present invention, active area 1303 includes phosphorus doped silicon, and active area 1303' includes boron doped silicon or silicon germanium.

Figure 14A:
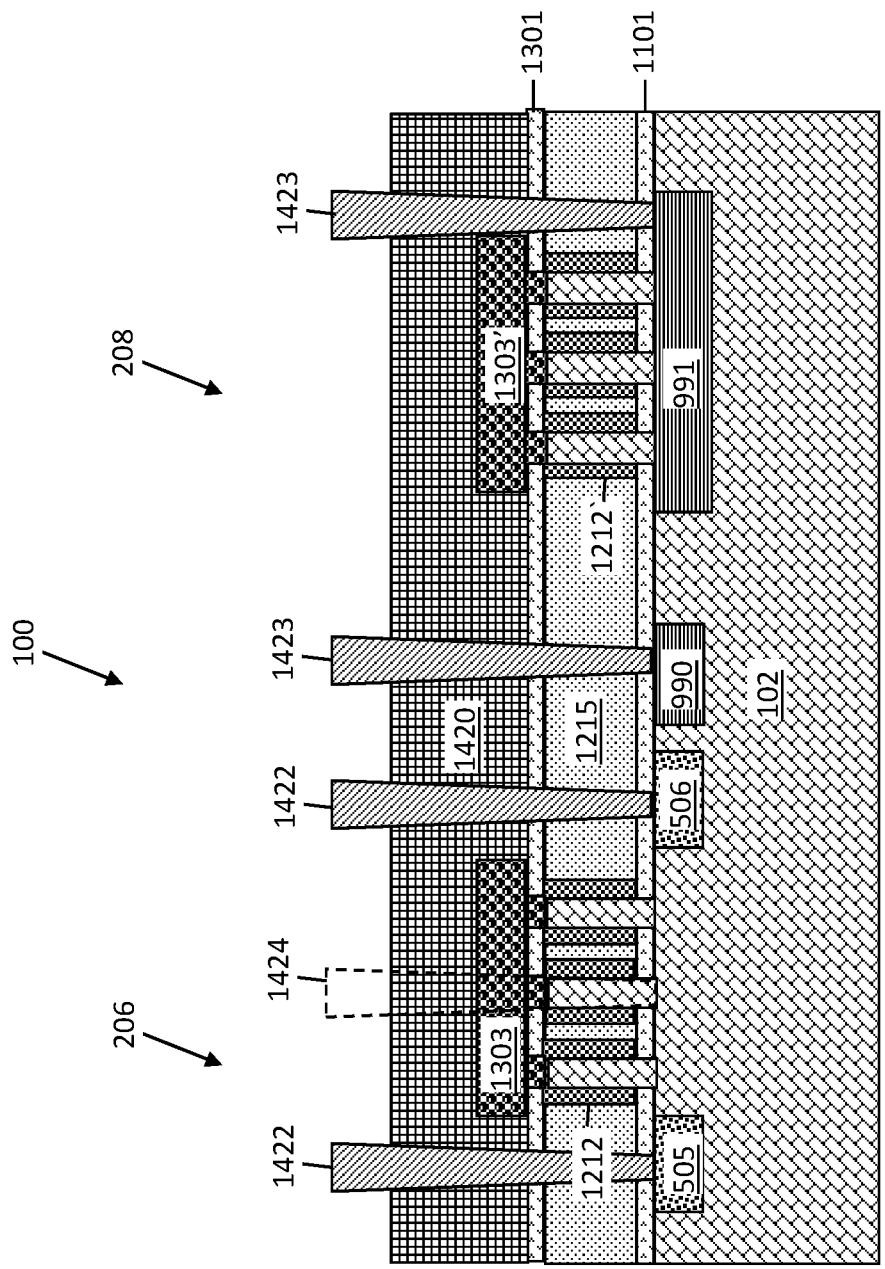
FIG. 14A depicts a cross-sectional side view of the semiconductor device subsequent to forming contacts.
Figures 14B, 14C:
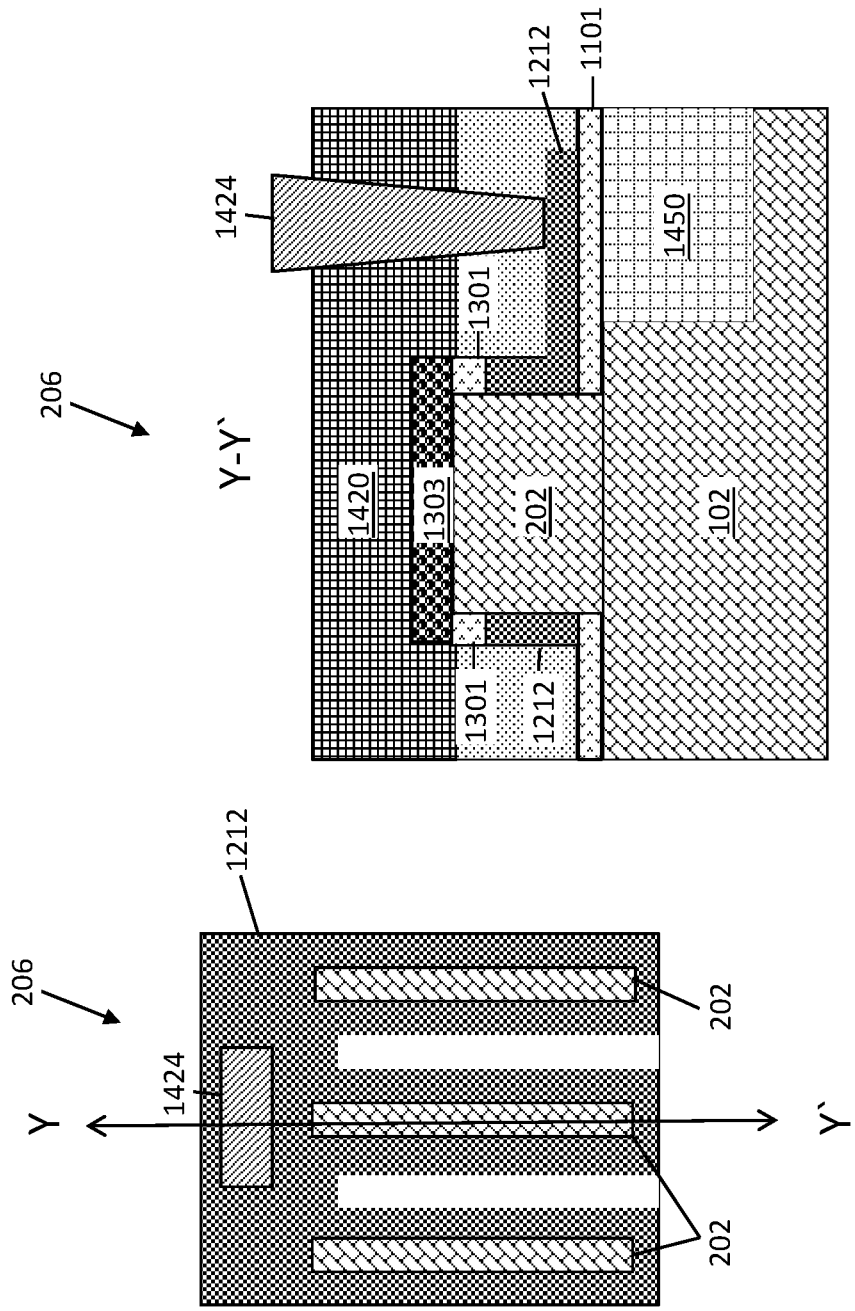
FIG. 14B depicts a top view of the semiconductor device showing the gate contact.
FIG. 14C depicts a cross-sectional side view through the Y-Y' axis of FIG. 14B.

FIG. 14A depicts a cross-sectional side view of the semiconductor device 100 subsequent to forming contacts 1422, 1423 to the doped active areas 505, 506, 990, 991, and a gate contact 1424. Gate contact 1424 is arranged adjacent to the fins 202, in another plane, as shown in FIGS. 14B and 14C. FIG. 14B depicts a top view of the showing the gate contact 1424 connection to the gate stack 1212. FIG. 14C depicts a cross-sectional side view through the Y-Y' axis of FIG. 14B;

Another layer of ILD 1420 is deposited on the second spacer 1301. The ILD 1420 includes one or more dielectric materials, for example, an oxide. Non-limiting examples of oxides for the ILD 1420 include tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The material of the ILD 1420 is the same, or different, than the material of the ILD 1215.

Contacts 1422 extend through the ILD 1420, second spacer 1301, ILD 1215, and first spacer 1101 to the doped active areas 505, 506 with the n-type dopant. Contacts 1423 extend through the ILD 1420, second spacer 1301, ILD 1215, and first spacer 1101 to the doped active areas 990, 991 with the p-type dopant.

To form the contacts 1422, 1423, trenches are formed by removing material of the ILD 1420, second spacer 1301, ILD 1215, and first spacer 1101. A resist, such as a photoresist, can be deposited and patterned to form the contact trenches in the layers of material. An etch process, such as a RIE, is performed to remove material down to the active areas 505, 506, 990, 991. The contact trenches are filled with a conductive material or a combination of conductive materials. The conductive material(s) is deposited in the trenches, such as a conductive metal, for example, aluminum, platinum, gold, tungsten, titanium, cobalt, or any combination thereof. The conductive material(s) of the contacts 1422 and 1423 is the same or different.

Figure 15:
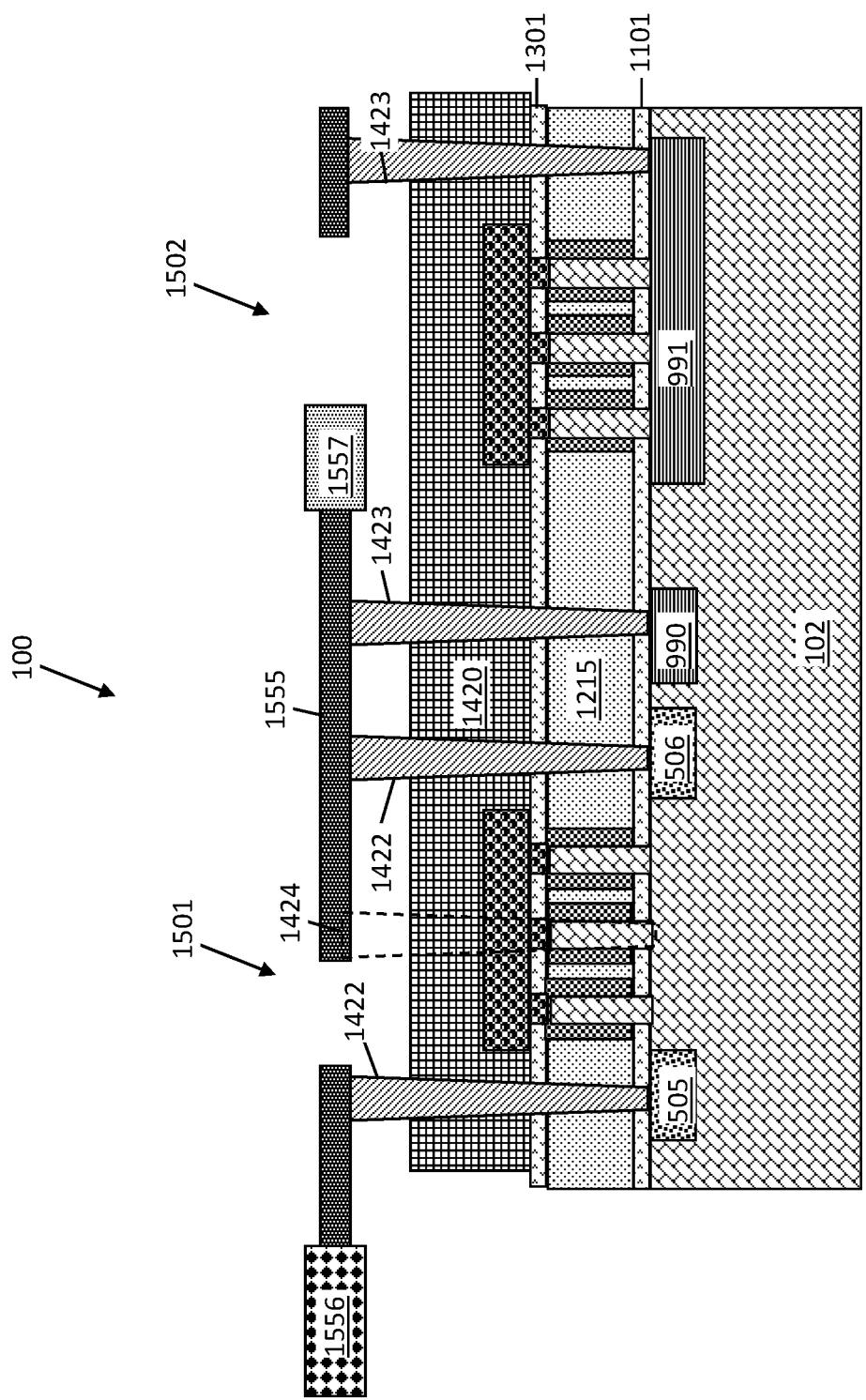

FIG. 15 depicts a cross-sectional side view of the semiconductor device 100 subsequent to coupling an input/output (I/O) device 1556 through a metal layer 1555 to the contacts 1422, 1423. Metal layer 1555 is deposited on ILD 1420. Metal layer 1555 couples the I/O device 1556 to the bipolar parasitic NPN device 1501. ESD travels as a current through the NPN junction from the drain (n-type) acting as the collector (active area 505), to the base/source combination (n-type) acting as the emitter (active area 506), and to the substrate (p-type) as the base (active area 990) to the ground 1557. The adjacent device 1502 is any type of conventional transistor device, e.g., a PFET device.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming one or more fins on a substrate;
   forming a first active area and a second active area, each comprising an n-type dopant, on the substrate at opposing ends of the one or more fins;
   forming a third active area comprising a p-type dopant on the substrate adjacent to the first active area and the second active area;
   depositing a first spacer material on the substrate beneath each fin of the one or more fins;
   depositing a gate stack that wraps around a vertical channel region of each fin of the one or more fins; and
   depositing a second spacer material on the gate stack of each fin of the one or more fins, and forming an active area on the second spacer material.

2. The method of claim 1, wherein the one or more fins comprises 1 to 100 fins.

3. The method of claim 1, wherein the opposing ends of the one or more fins are opposing horizontal ends.

4. The method of claim 1 further comprising coupling an input/output (I/O) device to the first active area.

5. A method of fabricating a semiconductor device, the method comprising:
   forming a plurality of fins on a substrate;
   forming a first active area and a second active area, each comprising an n-type dopant, on the substrate at opposing ends of the plurality of fins;
   forming a third active area comprising a p-type dopant on the substrate adjacent to the first active area and the second active area;
   depositing a first spacer material on the substrate beneath each fin of the plurality of fins;
   depositing a gate stack that wraps around a vertical channel region of each fin of the plurality of fins;
   depositing a second spacer material on the gate stack of each fin of the plurality of fins; and
   coupling an input/output (I/O) device to the first active area through a metal contact.

6. The method of claim 5, wherein the plurality of fins comprises 1 to 100 fins.

7. The method of claim 5, wherein a pitch (p) of the fins of the plurality of fins is about 20 to about 50 nm.

8. The method of claim 5 further comprising forming an active area on the second spacer material.

9. A semiconductor device comprising:
   one or more fins on a substrate;
   a first active area and a second active area, each comprising an n-type dopant, on the substrate at opposing ends of the one or more fins;
   a third active area comprising a p-type dopant on the substrate adjacent to the first active area and the second active area;
   a gate stack that wraps around a vertical channel region of each fin of the one or more fins;
   a second spacer material on the gate stack of each fin of the one or more fins; and
   an active area on the second spacer material.

10. The semiconductor device of claim 9, wherein the one or more fins comprises 1 to 100 fins.

11. The semiconductor device of claim 9, wherein the opposing ends of the one or more fins are opposing horizontal ends.

12. The semiconductor device of claim 9 further comprising depositing a first spacer material on the substrate beneath each fin of the one or more fins.

13. The semiconductor device of claim 9 further comprising an input/output (I/O) device coupled to the first active area through a metal contact.

* * * * *